United States Patent
Caplan et al.

(10) Patent No.: US 7,462,089 B2
(45) Date of Patent: Dec. 9, 2008

(54) MATERIAL FOR ELECTRODES OF LOW TEMPERATURE PLASMA GENERATORS

(75) Inventors: Malcolm Caplan, Fremont, CA (US); Sergel Evge'evich Vinogradov, St. Peterburg (RU); Valeri Vasil'evich Ribin, St. Peterburg (RU); Valentin Ivanovich Shekalov, St. Peterburg (RU); Philip Grigor'evich Rutberg, St. Peterburg (RU); Alexi Anatol'evich Safronov, St. Peterburg (RU)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 11/818,625

(22) Filed: Jun. 15, 2007

(65) Prior Publication Data

US 2007/0249256 A1    Oct. 25, 2007

Related U.S. Application Data

(62) Division of application No. 10/445,177, filed on May 23, 2003.

(30) Foreign Application Priority Data

Nov. 30, 2000  (RU) .............................. 2000129858
Nov. 28, 2001  (WO) ..................... PCT/US01/47685

(51) Int. Cl.
*H01J 9/04* (2006.01)
*H01J 9/12* (2006.01)
*H01J 9/00* (2006.01)
*H01J 1/14* (2006.01)
*B23K 35/22* (2006.01)
*H05B 7/06* (2006.01)

(52) U.S. Cl. ............................ 445/50; 445/46; 445/51; 313/346 R; 75/302

(58) Field of Classification Search .................. 445/60, 445/46, 50, 51; 75/302; 313/346 R
See application file for complete search history.

(56) References Cited

U.S. PATENT DOCUMENTS

| 4,168,565 A | 9/1979 | Ishii et al. |
| 4,229,873 A | 10/1980 | Bykhovsky et al. |
| 4,398,969 A * | 8/1983 | Melton et al. ................ 75/235 |

(Continued)

FOREIGN PATENT DOCUMENTS

WO    0537495 A1    4/1993

*Primary Examiner*—J. A. Lorengp
*Assistant Examiner*—Noah S Wiese
(74) *Attorney, Agent, or Firm*—John H. Lee; Alan H. Thompson

(57) ABSTRACT

Material for electrodes of low temperature plasma generators. The material contains a porous metal matrix impregnated with a material emitting electrons. The material uses a mixture of copper and iron powders as a porous metal matrix and a Group IIIB metal component such as $Y_2O_3$ is used as a material emitting electrons at, for example, the proportion of the components, mass %: iron: 3-30; $Y_2O_3$:0.05-1; copper: the remainder. Copper provides a high level of heat conduction and electric conductance, iron decreases intensity of copper evaporation in the process of plasma creation providing increased strength and lifetime, $Y_2O_3$ provides decreasing of electronic work function and stability of arc burning. The material can be used for producing the electrodes of low temperature AC plasma generators used for destruction of liquid organic wastes, medical wastes, and municipal wastes as well as for decontamination of low level radioactive waste, the destruction of chemical weapons, warfare toxic agents, etc.

19 Claims, 1 Drawing Sheet

U.S. PATENT DOCUMENTS

| | | |
|---|---|---|
| 5,126,622 A | 6/1992 | Jeong et al. |
| 5,128,584 A | 7/1992 | Choi |
| 5,318,468 A * | 6/1994 | Lotthammer et al. .......... 445/50 |
| 5,507,675 A | 4/1996 | Frost |
| 5,594,299 A * | 1/1997 | Bossert et al. ........ 313/346 DC |
| 5,609,777 A | 3/1997 | Apunevich et al. |
| 5,756,959 A * | 5/1998 | Freeman et al. ........ 219/121.49 |
| 5,865,980 A * | 2/1999 | Ray et al. .................... 205/367 |
| 5,911,919 A * | 6/1999 | Billings ...................... 252/516 |
| 2002/0080840 A1* | 6/2002 | Morton ........................ 372/57 |

* cited by examiner

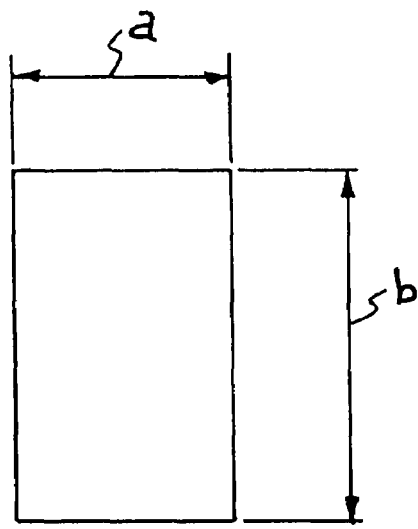
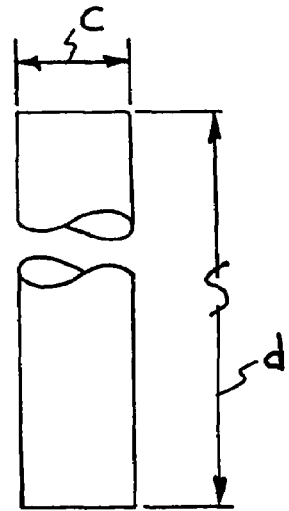
FIG. 1A  FIG. 1B
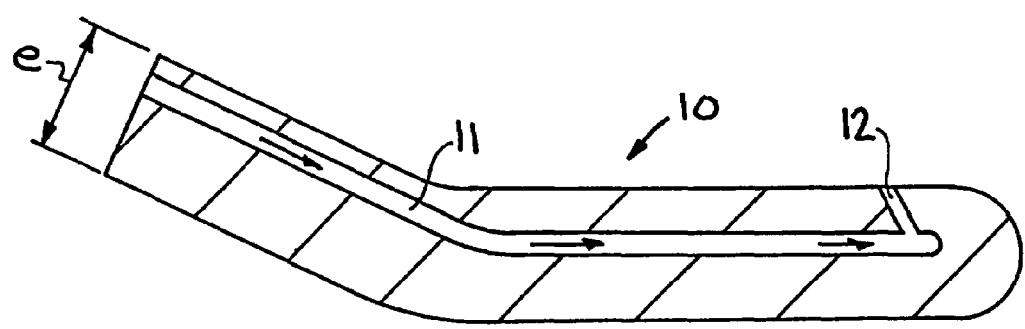
FIG. 2

MATERIAL FOR ELECTRODES OF LOW TEMPERATURE PLASMA GENERATORS

CROSS-REFERENCE TO RELATED APPLICATION

This application is a division of application Ser. No. 10/445,177 filed May 23, 2003 entitled "Materials for Electrodes of Low Temperature Plasma Generators" by inventors Malcolm Caplan, Sergei Evge'evich Vinogradov, Valeri Vasil'evich Ribin, Valentin Ivanovich Shekalov, Philip Grigor'evich Rutberg, Alexei Anatol'evich Safronov, Vasili Nikolaevich Shiryaev. This Application relates to Russian Patent Application No. 2000129858 filed Nov. 30, 2000. Now Russian Patent No. 21768333, dated Oct. 10, 2001.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the field of plasma engineering, particularly to electrodes for low temperature AC (alternating current and voltage) plasma generators, and more particularly the materials for fabricating such electrodes which have heat conduction, electric conductance, structural strength and electron emitting characteristics.

In the field of plasma engineering, substantial effort has been directed to manufacturing of electrodes for low temperature plasma generators providing emission of electrons and stable arc burning, i.e., AC plasma electrodes. Such electrodes have typically been made from copper and chromium carbide, although other materials and methods for production have been proposed.

In general, materials for electrodes (not AC plasma electrodes) containing barium and/or barium oxide as a component emitting electrons was proposed in U.S. Pat. No. 5,126,622 issued Jun. 30, 1992 to J. Jeong et al. Emitter of electrons is enclosed in porous metal material which has a lot of diffusion cavities. European Patent Application No. 0537495 published Apr. 21, 1993 proposes to mix dry metal powders with high melting point, high heat resistance and substances emitting electrons for manufacturing electrodes. The mixture is compacted in the sealed reaction vessel and is subjected to hot isostalic compacting to obtain a semifinished item which is processed on the machine-tool to receive the electrode of the designed shape. Barium aluminate is the substance emitting electrons.

U.S. Pat. No. 5,128,584 issued Jul. 7, 1992 to J. Choi proposes an impregnated dispersion electrode containing a porous metal matrix impregnated with the material, emitting electrons on the basis of scandium or scandium tungstate. By this means the availability of an emitting additive and metal matrix, providing current supply and fixating emitting addition, are common for all mentioned above patents. The present invention is based on the same principle but other combinations of components are used as a base and an emitter.

SUMMARY OF THE INVENTION

Material of the electrodes of low temperature plasma generators containing porous metal matrix impregnated with the material emitting electrons differs from those listed above in that it uses a mixture of copper and iron powders as a porous metal matrix and a Group IIIB metal-containing component (such as $Y_2O_3$) is used as a material emitting electrons at the following proportion of the components, mass %:

| | |
|---|---|
| Iron | 3-30 |
| Group IIIB metal component | 0.05-1 |
| Copper | the remainder |

Copper provides high level of heat conduction and electric conductance; iron decreases intensity of copper evaporation in the process of plasma creation providing increased strength and lifetime, the Group IIIB metal-containing component such as $Y_2O_3$ provides decreasing of electronic work function and stability of arc burning. Previous electrodes used in AC plasma generators have contained only copper or chromium carbide. The composition of the electrode of the invention contributes to a substantial increase in the lifetime of the electrodes to at least 10 times that of chromium carbide electrodes and 20 times that of copper electrodes. (The lifetime of the AC plasma electrode is that time after which the electrode must be replaced in an AC generator due to sufficient corrosion to cause the essential cease of function of the electrode.)

In an exemplary embodiment, dry metal powders of (Cu+Fe) and $Y_2O_3$ are mixed in the manufacture of electrodes. The received mixture is compacted on air in the mold in such a manner that cross-section areas of the compacted item and finished item relate as 4:1-8:1. Then the mixture is baked in shielding-reducing medium (hydrogen, dissociated ammonia) in temperature range of 900-1050° C. during 20 min-4 hours. After that, it is subjected to forging in temperature range of 850-950° C. to obtain the rod which has allowance on diameter of 2-3 mm or extrusions. Then mechanical processing is carried out to obtain ultimate dimensions.

BRIEF DESCRIPTION OF THE DRAWINGS

FIGS. 1A and 1B illustrate an embodiment of a blank of the electrode, with FIG. 1A being after compaction, and FIG. 1B being after forging.

FIG. 2 is a cross-sectional view of an embodiment of a finished electrode made in accordance with the invention.

DETAILED DESCRIPTION OF THE INVENTION

Uniformity of distribution of introduced charge components by member volume is of great importance for stable operation of the plasma generator electrodes. In this connection particular emphasis should have been placed to the process of mixing of the initial components having different density and properties.

The electrode of the invention includes the combination of Iron (Fe) and Copper (Cu) together with electron emitting materials selected from one or more components containing Group IIIB metals of the Periodic Table. Such Group IIIB metal-containing components can include Scandium (Sc), Lanthanum (La), Actinium (Ac), and preferably Yttrium (Y). Although several Group IIIB metal-containing components may be employed, effective components include boron, tungsten and/or oxygen in combination with one or more Group IIIB metals. A highly useful composition contains Yttrium oxide ($Y_2O_3$), which hereinafter is described in several exemplary embodiments of the invention.

So that to create the composition containing 30% of Fe and 0.1% of $Y_2O_3$, the mixing was carried out in three steps sequentially:

1. Mixing of 10 g of Cu, 5 g of Fe and 5 g of $Y_2O_3$, total 20 g.
2. Add to the resulting composition 80 g of Fe, 200 g of Cu and mix once more.
3. Add to the resulting composition 1410 g of Fe and 3290 g of Cu (total 5000 g) and mix once more and then compaction and baking of blanks is performed from the resulting charge.

It was found experimentally in creation of the invention that optimum compaction pressure is 300-400 MPa (3-4 $t/cm^2$). Pressure increases above 400 MPa (3-4 $t/cm^2$) results in appearance of bulging and cracks on the surface of baking blanks because of the evaporation of adsorbed films inside the blanks.

Baking in reducing medium (hydrogen, dissociated ammonia) protects porous material from internal oxidation. It was experimentally found that temperature range of baking is 900-1050° C., baking time is from 20 minutes till 4 hours. For typical cases, baking temperature is 1000° C., baking time is 2 hours.

After compaction and baking the blanks with dimensions indicated by arrows a and b of, for example, 60×90 mm were produced, as seen in FIG. 1A, and when they arrived for forging.

Forging pursues two goals:
    production of the blank of the required dimension,
    strength increasing, elimination of the residual porosity and improvement of the operating characteristics of the material.

Due to two following circumstances, it is difficult to forge copper:

Presence of <<brittleness zone>> of copper base in temperature range of 300-600° C.; presence of significant amount of brittle addition—yttrium oxide.

In the case being considered, the temperature range of forging was chosen in temperature range of 900-950° C. with time of exposure of 60 minutes at forging temperature. Forging was conducted in swages after 5 mm in a pass to the diameter with intermediate heating after each pass according to the scheme:

Ø60→Ø55→Ø45→Ø40→Ø35→Ø29 mm as shown by arrow d in FIG. 1B, with the length going from 90 mm to 280 mm, as seen by arrow d in FIG. 1B.

Samples for determination of mechanical properties were made along with the blanks for electrodes. The main mechanical properties are represented in Table 1.

From represented data, it transpires that insertion of iron tends to increase the strength. Insertion of $Y_2O_3$ decreases the strength. Presence of 1% mass $Y_2O_3$ and more essentially hampers plastic deformation and further processing of the blanks.

The range of component content is chosen from the following considerations. Increase of $Y_2O_3$ content above than 1% decreases material plasticity and it is impossible to obtain the members of required shape and dimensions. Decrease of the Group IIIB metal component (such as $Y_2O_3$) content below about 0.1%, and in some cases below about 0.05%, is detrimental to arc stability, and decrease of Fe below 3%, greatly reduces strength. Increase of Fe content above 30% impermissibly decreases heat conduction and electric conduction.

Mechanical processing and bending of blanks were carried out to obtain finished member, see FIG. 2, and operating characteristics of the material of the low temperature plasma generator were determined.

The finished electrode, indicated at 10, of FIG. 2, has, for example, a length of 260 mm and cross-section as indicated by arrow e of 25 mm, with a water cooling channel 11, 12 formed therein through which water flows as indicated by the flow arrows.

It has thus been shown that the present invention provides a material for electrodes of low temperature AC plasma generators. This material for low temperature AC plasma generators contains a porous metal matrix impregnated with the material emitting electrons and uses a baked mixture of copper and iron powders as a porous metal matrix and Group IIIB metal component (yttrium oxide $Y_2O_3$) inserted in the process of mixing of matrix powders as a material emitting electrons at the following proportion of the components, mass %:

| Iron | 3-30 |
| --- | --- |
| $Y_2O_3$ | 0.05-1 |
| Copper | the rest |

In another example, three AC plasma electrodes containing (1) copper, (2) chromium carbide and (3) the above 30% Cu, 0.1% $Y_2O_3$, remainder Fe composition of the invention, were manufactured and operated in two types of AC plasma generators, a single phase 10 kW generator and a 50 kW three phase plasma generator. The results of testing are indicated below:

TABLE 1

| | | Composition number | | | | | |
| --- | --- | --- | --- | --- | --- | --- | --- |
| Basic characteristic of the material | | 1 | 2 | 3 | 4 | 5 | 6 |
| Chemical composition | Fe | 3 | 10 | 30 | 30 | 30 | 30 |
| | $Y_2O_3$ | 0.1 | 0.1 | 0.1 | 0.25 | 0.5 | 1.0 |
| | Cu | Base | Base | Base | Base | Base | Base |
| Mechanical properties | Ultimate strength to the break, $N/mm^2$ | 200-210 | 225-235 | 255-280 | 180-190 | 175-185 | 125-135 |
| | Yield strength, $N/mm^2$ | 50-60 | 85-100 | 145-150 | 100-105 | 95-105 | 85-90 |

TABLE 2

| Electrode Composition | 10 kW generator lifetime | 50 kW generator lifetime |
|---|---|---|
| copper | 10 hrs | 3 hrs |
| chromium carbide | 30 hrs | 10 hrs |
| copper/$Y_2O_3$/iron (new material) | 200 hrs | >100 hrs |

The data in Table 2 indicates that Group IIIB metal components in combination with iron and copper provide enhanced lifetimes to AC plasma electrode compositions employed in an AC plasma generator.

While a particular embodiment, including specific materials and parameters has been described and illustrated to exemplify and teach the principles of the invention, such is not intended to be limiting. Modifications and changes may become apparent to those skilled in the art, and it is intended that the invention be limited only by the scope of the appended claims.

The invention claimed is:

1. A method for producing electrodes of low temperature plasma generators, comprising: providing a mixture of dry metal powders of (Cu+Fe) and a Group IIIB metal-containing component, the IIIB metal-containing component being present in the mixture at between 0.05 and 1%, compacting the mixture of powders in a mold, baking the compacted mixture, forging the baked compacted mixture to form an electrode, and mechanically processing the electrode to a finish member having ultimate dimensions.

2. The method of claim 1, wherein compacting the mixture of powders is carried out such that cross-section areas of the compacted powders and the finish member related as 4:1-8:1.

3. The method of claim 1, wherein baking the compacted mixture is carried out in a shielding-reducing medium.

4. The method of claim 3, wherein the shielding-reducing medium comprises hydrogen, dissociated ammonia.

5. The method of claim 3, wherein the baking is carried out in a temperature range of about 900-1050° C.

6. The method of claim 5, wherein the baking is carried out in a time period of about 20 min-4 hours.

7. The method of claim 3, wherein forging the baked compacted mixture is carried out in a temperature range of about 850-950° C.

8. The method of claim 7, wherein the forging is carried out to form an electrode having an allowance on diameter of about 2-3 mm.

9. The method of claim 3, wherein mechanical processing of the member is carried out to produce an electrode having a length of about 260 mm and diameter of about 25 mm.

10. The method of claim 2, wherein the compacted powders have a length of about 90 mm and width of about 60 mm, and the finish member has a length of about 280 mm and width of about 29 mm.

11. The method of claim 1, additionally including forming at least one cooling channel in the thus formed electrode.

12. A method for producing electrodes of low temperature plasma generators, comprising: providing a mixture of dry metal powders of (Cu+Fe) and $Y_2O_3$, wherein the mixture is formed to create a composition of about 3-30% of Fe, about 0.05-0.1% of $Y_2O_3$, and the remainder of Cu; compacting the mixture of powders in a mold, baking the compacted mixture, forging the baked compacted mixture to form an electrode, mechanically processing the electrode to a finish member having ultimate dimensions.

13. The method of claim 12, wherein mixing of the Fe, $Y_2O_3$ and Cu powders is carried out in three steps sequentially: mixing of about 10 g of about Cu, 5 g of Fe, and about 5 g of $Y_2O_3$, adding to the resulting composition of about 80 g of Fe, 200 g of Cu and mix once more, and adding to the resulting composition about 1410 g of Fe and about 3290 g of Cu and mix once more.

14. The method of claim 1, wherein compacting is carried out at a compaction pressure of about 300-400 Mpa (3-4 t/cm$^2$).

15. The method of claim 1, wherein forging is carried out in swages of about 5 mm in a pass to the diameter with intermediate heating after each pass.

16. The method of claim 15, wherein forging is carried out at a temperature range of about 900-950° C. with a time of exposure of about 60 minutes at forging temperature.

17. A method for producing electrodes of low temperature plasma generators, comprising: providing a mixture of dry metal powders of (Cu+Fe) and a Group IIIB metal-containing component, the Cu, Fe and IIIB metal-containing component being the only elements present in the mixture, compacting the mixture of powders in a mold, baking the compacted mixture, forging the baked compacted mixture to form an electrode, and mechanically processing the electrode to a finish member having ultimate dimensions.

18. The method of claim 1, additionally including forming the mixture to create a composition of about 3-30% of Fe, about 0.05-0.1% of $Y_2O_3$, and the remainder of Cu.

19. The method of claim 1, wherein the Group IIIB metal-containing component is $Y_2O_3$.

* * * * *